(12) United States Patent
Xu et al.

(10) Patent No.: US 9,660,299 B2
(45) Date of Patent: May 23, 2017

(54) STRAIN MEASUREMENT BASED BATTERY TESTING

(71) Applicant: Southwest Research Institute, San Antonio, TX (US)

(72) Inventors: Jeff Qiang Xu, San Antonio, TX (US); Joe Steiber, Spring Branch, TX (US); Craig M. Wall, San Antonio, TX (US); Robert Smith, Fair Lawn, NJ (US); Cheuk Ng, San Antonio, TX (US)

(73) Assignee: SOUTHWEST RESEARCH INSTITUTE, San Antonio, TX (US)

( * ) Notice: Subject to any disclaimer, the term of this patent is extended or adjusted under 35 U.S.C. 154(b) by 526 days.

(21) Appl. No.: 14/102,197

(22) Filed: Dec. 10, 2013

(65) Prior Publication Data

US 2015/0160302 A1    Jun. 11, 2015

(51) Int. Cl.
*G01R 31/36* (2006.01)
*H01M 10/42* (2006.01)
*H01M 10/48* (2006.01)

(52) U.S. Cl.
CPC ....... *H01M 10/42* (2013.01); *H01M 10/4285* (2013.01); *G01R 31/3679* (2013.01); *H01M 10/48* (2013.01)

(58) Field of Classification Search
CPC .............. G01R 31/3679; H01M 10/48; H01M 10/4285

USPC .......................................... 324/427
See application file for complete search history.

(56) References Cited

U.S. PATENT DOCUMENTS

| | | | |
|---|---|---|---|
| 6,407,553 B1 | 6/2002 | Anderson et al. | |
| 7,593,821 B2 * | 9/2009 | Plett | H01M 10/42 320/132 |
| 2008/0097704 A1 | 4/2008 | Notten et al. | |
| 2012/0286739 A1 | 11/2012 | O'Brien, Jr. et al. | |
| 2014/0107949 A1 * | 4/2014 | Arnold | G01R 31/3679 702/42 |
| 2014/0368205 A1 * | 12/2014 | Svensson | H01M 10/48 324/426 |
| 2015/0280290 A1 * | 10/2015 | Saha | H01M 10/48 429/50 |
| 2015/0311572 A1 | 10/2015 | Sung et al. | |

* cited by examiner

*Primary Examiner* — Richard Isla Rodas
*Assistant Examiner* — Manuel Hernandez
(74) *Attorney, Agent, or Firm* — Grossman, Tucker et al

(57) ABSTRACT

A method and system for strain-based estimation of the state of health of a battery, from an initial state to an aged state, is provided. A strain gauge is applied to the battery. A first strain measurement is performed on the battery, using the strain gauge, at a selected charge capacity of the battery and at the initial state of the battery. A second strain measurement is performed on the battery, using the strain gauge, at the selected charge capacity of the battery and at the aged state of the battery. The capacity degradation of the battery is estimated as the difference between the first and second strain measurements divided by the first strain measurement.

30 Claims, 7 Drawing Sheets

500

---

Apply a strain gauge to a battery

510

↓

Measure a first strain of the battery (S1), using the strain gauge, at a selected charge capacity of the battery and at an initial state of the battery

520

↓

Measure a second strain of the battery (S2), using the strain gauge, at the selected charge capacity of the battery and at an aged state of the battery

530

↓

Estimate the capacity degradation of the battery from the initial state to the aged state as equal to (S2 − S1) / S1

Select a first charge cycle test range bounded by a lower charge capacity value ($Q_{low}$) and a higher charge capacity value ($Q_{high}$)

610

--- at an initial state of the battery:
        perform a charge-discharge cycle over the first test range;
        obtain a strain gauge measurement of the battery at one or more
            intervals over the first test range;
        measure the voltage ($V_{min}$) of the battery at the $Q_{low}$ bound of the first
            test range;
        measure the voltage ($V_{max}$) of the battery at the $Q_{high}$ bound of the first
            test range

620

--- at an aged state of the battery:
        perform a charge-discharge cycle over a second test range bounded by
            $V_{min}$ and $V_{max}$;
        obtain a strain gauge measurement of the battery at one or more
            intervals over the second test range

630

---

Calculate a degradation value for one or more of the intervals, the degradation value equal to the difference between the initial state strain gauge measurement and the aged state strain gauge measurement divided by the initial state strain gauge measurement

STRAIN MEASUREMENT BASED BATTERY TESTING

GOVERNMENT RIGHTS CLAUSE

This invention was made with government support under Award No. DE-AR0000277 awarded by U.S. Department of Energy. The government has certain rights in the invention.

FIELD OF INVENTION

The present disclosure relates to strain-based testing of batteries and battery cells, and in particular to strain-based estimation of the state of health of battery cells and systems.

BACKGROUND

Batteries, including lithium-ion batteries, may be used for a variety of target applications that require relatively higher levels of energy storage, power delivery and recharge cycle capability. These applications may include, for example, hybrid electric vehicles (HEVs), plug-in hybrid electric vehicles (PHEVs), battery electric vehicles (BEVs), solar/wind (renewable) power smoothing, power grid frequency regulation, power grid storage for peak shaving and other applications. Parties, ranging from manufacturers to distributors to end users of these batteries, have an interest in determining the useful life span of the batteries and the charge capacity degradation that has occurred in an aged battery (e.g., the state of health or SOH of the battery). Accurate SOH determination may facilitate dual-use of battery systems and improve the value estimation of the battery after retirement from a primary application. Unfortunately, the lifespan may vary considerably depending on the target application and in particular the drive cycle (rate of charge/discharge) of the application, which may include, for example, the depth of discharge and the charge and discharge rates.

Existing battery test procedures generally involve some combination of voltage, current, resistance, impedance and temperature measurements. These procedures typically do not provide the desired level of accuracy across a broad range of battery chemistries.

What is needed, therefore, are methods and systems for estimation of the state of health or capacity degradation of an aged battery that provide improved accuracy, reliability and efficiency.

SUMMARY

The present disclosure describes methods and systems for strain-based estimation of the state of health (SOH) of battery cells. As a battery ages, the rate of change of volume of the cell (and therefore strain on the cell), with respect to charge capacity, also changes.

A method for estimating SOH of a battery may include the following operations. A strain gauge is applied to the battery. A first strain measurement is performed on the battery, using the strain gauge, at a selected charge capacity of the battery and at an initial state of the battery. The initial state may be associated with, for example, a new battery. A second strain measurement is performed on the battery, using the strain gauge, at the selected charge capacity of the battery and at a later or aged state of the battery. The capacity degradation of the battery is estimated as the difference between the first and second strain measurements divided by the first strain measurement.

In some embodiments, the state of health of the battery may be based on an average of estimated capacity degradations (as described herein), where each estimated capacity degradation is associated with a particular charge capacity of the battery selected from a bounded range of charge capacities.

BRIEF DESCRIPTION OF DRAWINGS

The above-mentioned and other features of this disclosure, and the manner of attaining them, will become more apparent and better understood by reference to the following description of embodiments described herein taken in conjunction with the accompanying drawings, wherein:

FIG. 5 illustrates a flowchart of operations of one exemplary embodiment consistent with the present disclosure;

FIG. 6 illustrates a flowchart of operations of another exemplary embodiment consistent with the present disclosure.

DETAILED DESCRIPTION OF PREFERRED EMBODIMENTS

Figure 1:
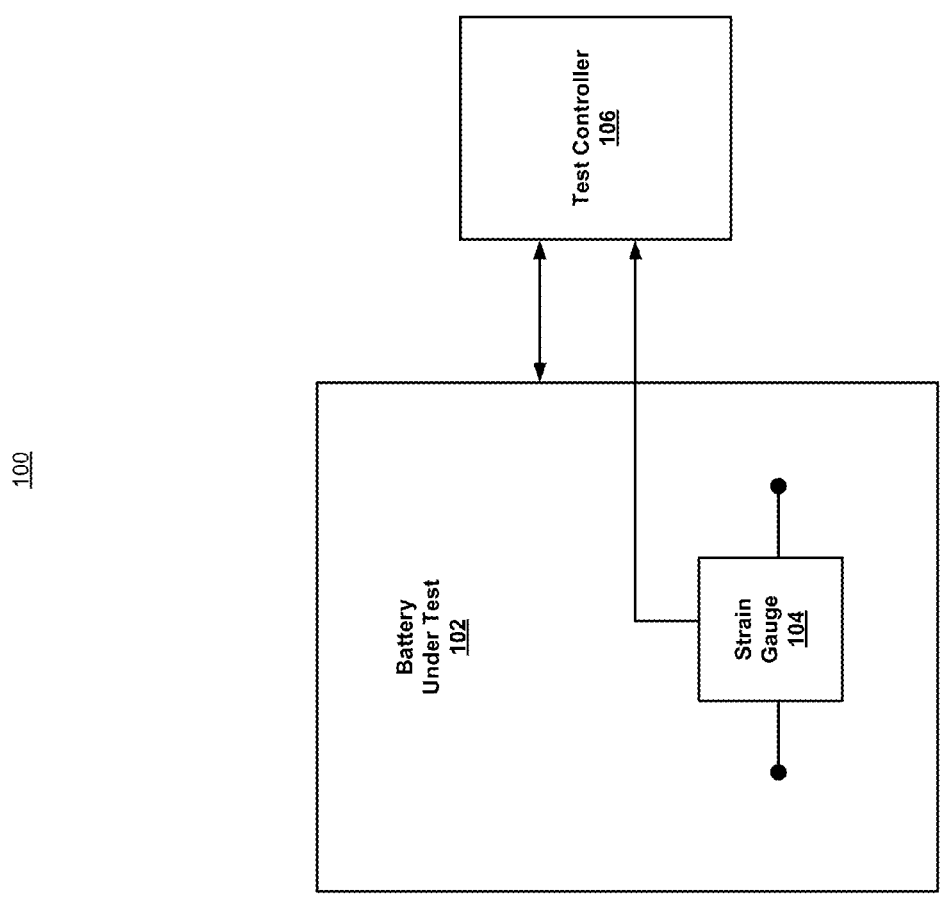
FIG. 1 illustrates a top-level block diagram of one exemplary embodiment consistent with the present disclosure.

It may be appreciated that the present disclosure is not limited in its application to the details of construction and the arrangement of components set forth in the following description or illustrated in the drawings. The invention(s) herein may be capable of other embodiments and of being practiced or being carried out in various ways. Also, it may be appreciated that the phraseology and terminology used herein is for the purpose of description and should not be regarded as limiting as such may be understood by one of skill in the art.

Throughout the present description, like reference characters may indicate like structure throughout the several views, and such structure need not be separately discussed. Furthermore, any particular feature(s) of a particular exemplary embodiment may be equally applied to any other exemplary embodiment(s) of this specification as suitable. In other words, features between the various exemplary embodiments described herein are interchangeable, and not exclusive.

The present disclosure relates to strain-based estimation of the state of health (SOH) of batteries, battery cells, modules or pack systems. For example, a battery pack may comprise a number of battery cells configured in any suitable arrangement, typically to provide a desired voltage, current and/or form factor. As a battery ages, the charge capacity of the battery generally degrades due to undesirable side effects (electrode degradation) associated with the chemical reactions involved in the charging and discharging process. These changes over time, for example, in the internal crystal structure of the battery, can cause the volume of the battery cell to vary. A strain gauge may be configured to measure changes in one or more of the dimensions of the battery, for example length, width, height or any combination thereof. These dimensional changes may be associated with a change in the volume of the battery during charging, discharging and/or rest periods, as will be described in greater detail herein. The strain gauge measurement may thus be used to predict or estimate the battery's SOH as it ages. It will be appreciated that this may be useful to determine when the battery should be retired or re-purposed as well as the relative value of the battery at any point in its life cycle.

Many types of batteries exist which may be based on different chemical reactions between their constituent chemical components. For example, lithium ion batteries are based on lithium ion intercalation and de-intercalation mechanisms during the charging and discharging processes. Both metal oxides and carbon-based electrode materials are ion-intercalation compounds or elements. During charging or discharging, reversible crystallographic strains take place due to the electrochemical force or the electromotive force that results in a volume change in the material. The strain gauge can be implemented to monitor the reversible process, which is correlated with the stages of intercalation/de-intercalation and can be expressed as a function of the state of charge (SOC), state of discharge (SOD) and/or absolute charge capacity (Q) of the battery. When the strain gauge is positioned on the battery, the measurements obtained may be correlated to the SOC, SOD and/or the SOH of the battery cell, module, or pack system. The change of strain measurement as each cell undergoes a number of charge/discharge cycles can be used to interpret the SOH of the cell at a given charge capacity.

Continuing with the example of the lithium ion battery, during the charging process lithium ions are extracted from the cathode (de-intercalation) and inserted into the anode (intercalation). During the discharging process, lithium ions move in the opposite direction. Modern lithium-ion batteries may often use mixed metal oxides as the cathode and graphite or amorphous carbon or silicon or silicon-carbon composite or carbon-tin alloy as the anode. The electrode materials experience volume strain during intercalation and de-intercalation processes. The volume change is the combination and macro-expression of electrode material crystalline structure change, expansion, and/or shrinkage due to electrochemical or electromotive forces on the cathode and anode. This phenomenon is dependent on the electrode chemistry, the related material's physical characteristics, cell formats, and the cell fabrication process. Since the electrode strain is a direct reflection of the percentage of lithium ion molar percentage insertion and extraction at each state of charge, embodiments of the present disclosure may identify the correlation between battery volume changes versus the SOC and SOD by decoupling temperature effect on the strain gauge signal. The electro-chemical reaction that takes place during charging and discharging may be expressed as follows when $LiFePO_4$ is used as the cathode, and graphite carbon is used as the anode:

Cathode during charge from 0% SOC to x*100% SOC:

$$LiFePO_4 \rightarrow Li_{1-x}FePO_4 + xLi^+ + xe^-$$

Cathode during discharge from 0% SOD to x*100% SOD:

$$FePO_4 + xLi^+ + xe^- \rightarrow Li_xFePO4$$

Anode during charge from 0% SOC to x*100% SOC:

$$6C + xLi^+ + xe^- \rightarrow Li_xC_6$$

Anode during discharge from 0% SOD to x*100% SOD:

$$LiC_6 \rightarrow Li_{1-x}C_6 + xLi^+ + xe^-$$

As the battery cell undergoes numerous charge/discharge cycles a degradation of the electrode materials is caused by the repeated intercalation and de-intercalation of lithium ions inside the material's crystal structure and other undesirable side reactions. The degree of material crystal structure change correlates with the volume change of the battery as cycling continues. In other words, for example, the measured strain at the $10^{th}$ charging cycle will be different from the measured strain at the 20th or 100th charging cycle. As a result, this expected and gradual change of strain can be used to formulate a predictable assessment of a battery cell's SOH, as will be described in greater detail herein.

Strain is generally proportional to both the partial change due to crystallographic change of electrode materials and the partial change due to temperature. Temperature may be affected by both internally generated heat as well as the external or ambient test environment temperature. Crystallographic change and temperature, however, may be decoupled by holding temperature relatively constant or by allowing electrochemical equilibrium to be reached before measuring strain, at which point detectable differences in strain measurements may be assumed to be caused by crystallographic change, and therefore aging of the battery.

Referring now to FIG. 1, there is shown a top-level block diagram 100. A system configured to perform strain-based estimation of the SOH of a battery 102 may include a strain gauge 104 applied to the battery and a test controller 106 configured to measure one or more properties of the battery, including the strain, under various test conditions. The strain gauge 104 may be any device configured to measure the strain of an object, in this case battery 102. The strain may be associated with a change in volume of the battery at various states of charge capacity, age, temperature and other conditions. In some embodiments, the strain gauge 104 may be applied at a position and orientation that measures the battery cell expansion and contraction, during cell charge/discharge cycles, along a dimension of the battery that exhibits the maximum expansion and contraction. For example, if, as the battery volume changes, the major portion of that change occurs along the width dimension, the strange gauge may be oriented along the width dimension. These positions/orientations may depend on the cell design (cylindrical, pouch, prismatic, etc.) and may also be dependent on battery chemistry.

In some embodiments, the strain gauge 104 may be applied with direct physical contact to the battery or battery cells. In other embodiments, the strain gauge 104 may be applied to a strap or other device that is configured to secure one or more cells of a battery pack. This arrangement may provide a cost benefit by reducing the number of strain gauges required and may also provide additional beneficial temperature insulation between the strain gauge and the battery cells.

Figure 2:
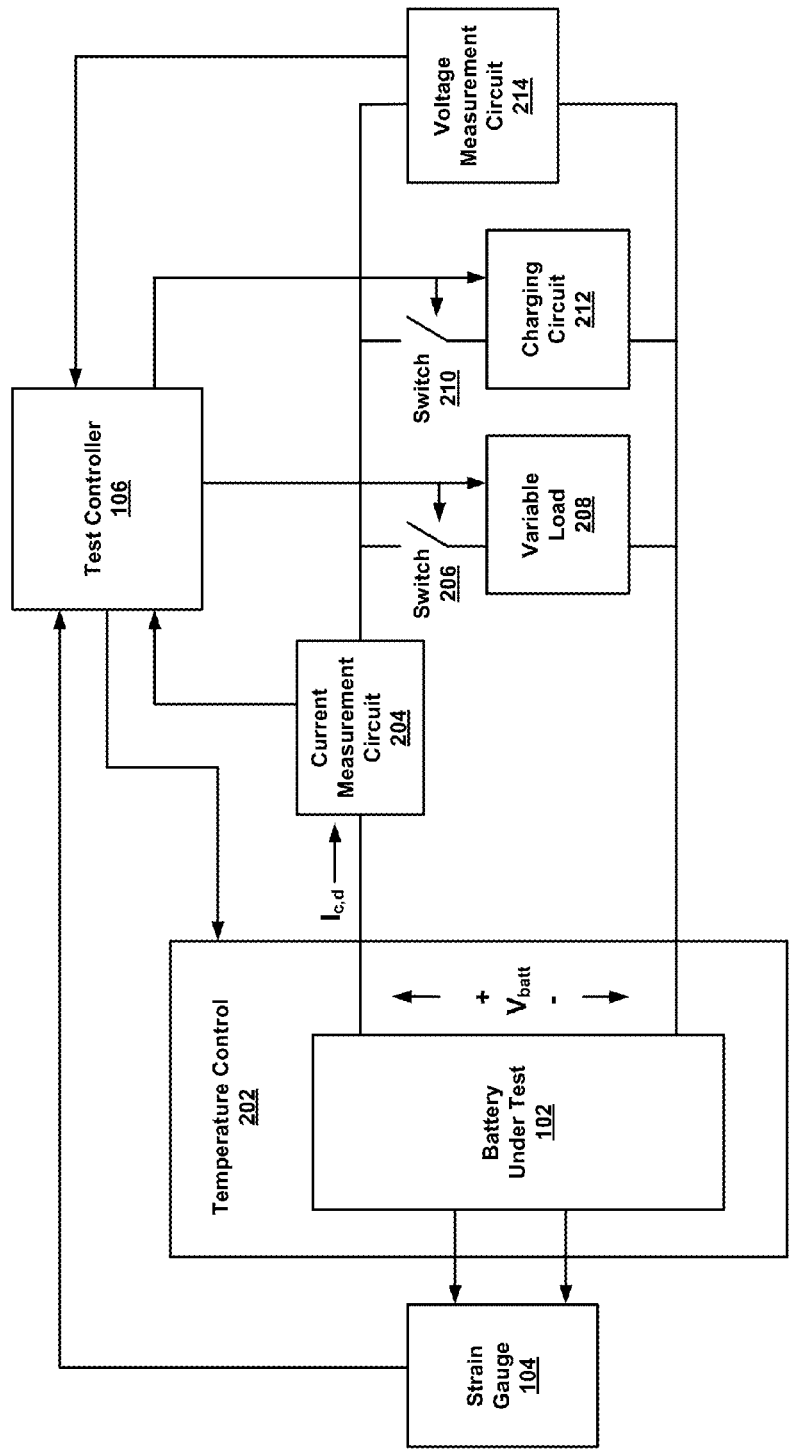
FIG. 2 illustrates a system block diagram of one exemplary embodiment consistent with the present disclosure.

Referring now to FIG. 2 there is shown a system block diagram 200 of one exemplary embodiment consistent with the present disclosure. A system configured to perform strain-based estimation of the state of health of battery cells 102 may include any of: a current measurement circuit 204, a voltage measurement circuit 214, a variable load 208 and associated switch 206, a charging circuit 212 and associated switch 210, and a temperature control module 202, in addition to the strain gauge 104 and test controller module 106. The battery (or cell) to be tested 102 may be maintained at a controlled temperature prior to and/or during the test by temperature control module 202, which in some embodiments may be an oven or other suitable heating or cooling device. The temperature setting may be determined and/or monitored by test controller module 106 through any suitable type of communication signal.

Current measurement circuit 204 may be configured to measure the electric current flowing through the battery 102 at various times during the charge/discharge cycle testing, as will be explained in greater detail herein. The current may be a charging current $I_c$ to re-charge the battery, or a discharging current $I_d$, to drain the battery. Voltage measurement circuit 214 may be configured to measure the voltage, $V_{batt}$ associated with the battery 102 at any point during the cycle. Voltage measurements may be performed while the battery is being charged, drained, or while the battery is in an open circuit condition, depending on the stage of testing.

Variable load 208 may be configured to drain the battery 102, when switched into the circuit through switch 206 under the control of test controller module 106, as part of a discharge cycle. A desired discharge current $I_d$ may be generated by adjusting the impedance of load 208 which may be set by controller 106. The discharge pulse duration (or pulse width) may also be set by controller 106 based on the timing of switch 206 state changes from open to close and back to open. For example, closing switch 206 for one second will cause a one second discharge current pulse to flow from battery 102 through the variable load 208. If, for example, the battery supplies V volts and the variable load is set to an impedance of R ohms, the discharge current pulse may be V/R amps.

Charging circuit 212 may be configured to charge the battery 102, when switched into the circuit through switch 210 under the control of test controller module 106 as part of a charge cycle. Charging circuit 212 may be set or adjusted by controller 106 to generate a desired charge current $I_c$. The charge pulse duration (or pulse width) may also be set by controller 106 based on the timing of switch 210 state changes.

Test controller module 106 may thus be configured to perform test operations on battery 102, for example as part of a charge/discharge cycle, as will be described in greater detail herein. These test operations may include draining the battery to any desired depth of discharge and cycling the battery around that DOD through charge and discharge current pulses of controllable duration and amperage. Test controller module 106 may further be configured to monitor the current and voltage of the battery 102 during these test operations while also maintaining and monitoring the temperature of the battery. In some embodiments, the charge/discharge cycle may be performed at a continuous current rate and/or a continuous power rate. In some embodiments, the charge/discharge cycle may be performed at a variable current rate and/or a variable power rate. In some embodiments, the charge/discharge cycle may be a practical driving cycle in a battery powered propulsion system. In some embodiments, the charge/discharge cycle may be a practical load cycle in an energy storage battery system.

Figure 3:
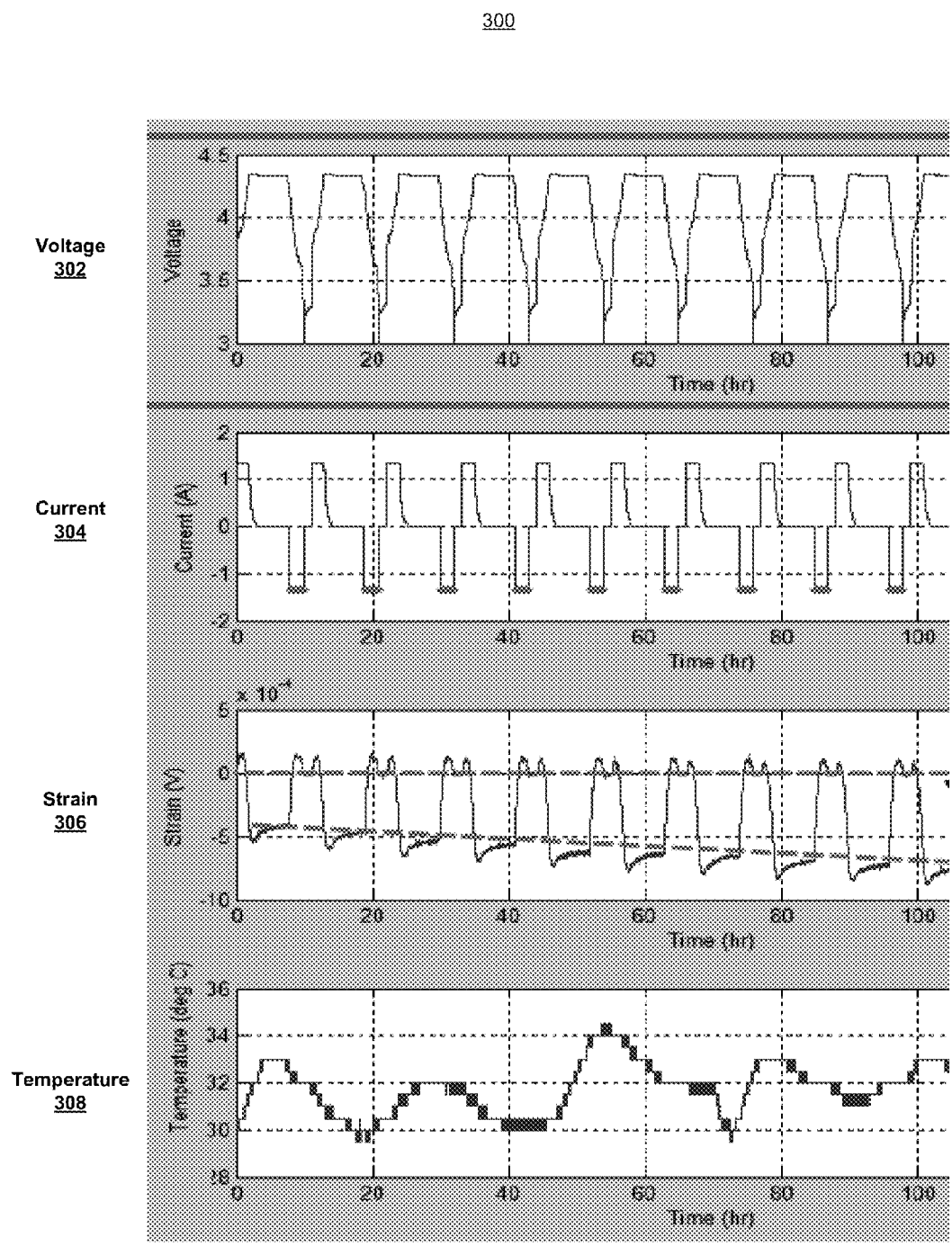
FIG. 3 illustrates test measurement graphs of one exemplary embodiment consistent with the present disclosure.

FIG. 3 illustrates test measurement graphs 300 of one exemplary embodiment consistent with the present disclosure. Measured battery voltage 302 is shown over multiple charge/discharge cycles that span a time period greater than 100 hours, in this example, as the battery is aged during the test from an initial state to an aged state. The initial state may correspond to the state of a new battery, for example, at the time of manufacture or after only limited use (e.g., less than 5 charge/discharge cycles). A battery at an aged state may correspond to a battery that has undergone a longer period of use (e.g., more than 100 charge/discharge cycles).

The corresponding battery current 304 is also shown over the test cycles. As can be seen from these plots 302, 304, there is no noticeable change in either voltage or current as the battery ages. The measured strain 306, expressed as a signal voltage from the strain gauge, however, is shown to exhibit a detectable variation over time. Plot 308 indicates the battery temperature, which is maintained at a 30 degree Celsius controlled environment within a range of 30 to 34 degrees Celsius, measured temperature fluctuation during cycles which may correspond to a nominal operating temperatures range for the battery.

Figure 4:
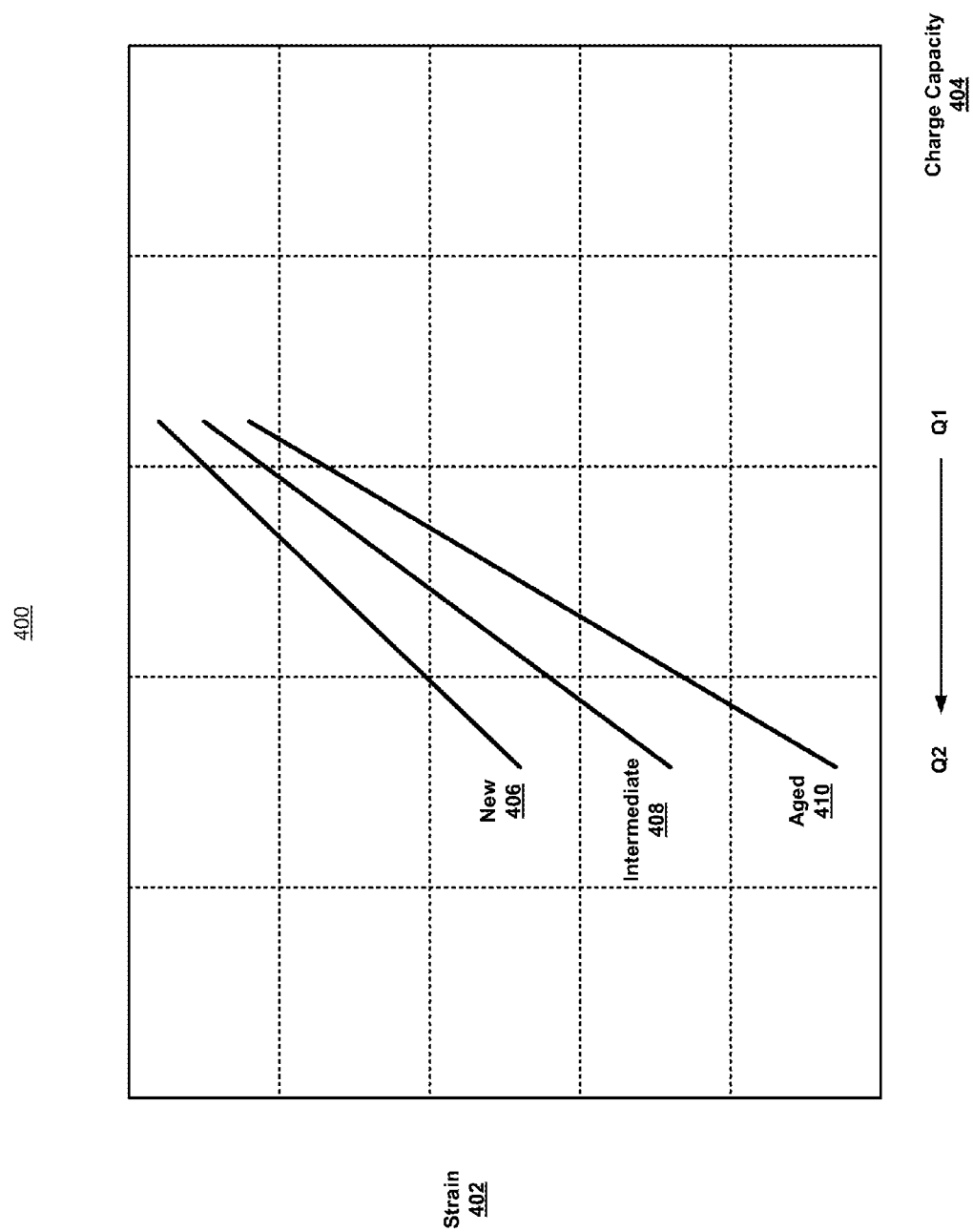
FIG. 4 illustrates test measurement graphs of another exemplary embodiment consistent with the present disclosure.

FIG. 4 illustrates test measurement graphs 400 of another exemplary embodiment consistent with the present disclosure. In this graph, the strain measurement 402 is represented as a function of charge capacity 404 at three different age states of the battery 406, 408, 410, representing new, intermediate and aged states respectively. These age states may correspond, for example, to charge cycles from FIG. 3 selected from the left hand, middle and right hand portions of the strain measurement 306 respectively. As can be seen, when the battery is charged from a first charge capacity state Q1 to a second charge capacity state Q2, the strain changes. The rates of change, however, as well as the actual values, vary with battery age. Alternatively, the strain measurement can also be represented as a function of discharge capacity at three different age states of the battery to derive a similar trend for the rates of strain changes from Q1 capacity to Q2 capacity.

A new battery cell may therefore undergo an initial charge/discharge cycle, with strain measurements taken at any number of charge capacity intervals throughout the cycle (from Q1 to Q2), to profile or calibrate the battery at the beginning of life. This initial calibration curve, as represented for example in 406, may then be used as a basis for comparison with subsequent strain measurements taken at later stages in the life of the battery, for example 410. The difference in measured strain between the new battery and the aged battery, relative to the measured strain of the new battery, provides an indication of the degradation in charge capacity of the aged battery at a particular charge capacity point within the cycle range. An average of these degradation values taken at different charge capacity points within the cycle range may be used to estimate the SOH of the battery.

FIG. 5 illustrates a flowchart of operations 500 of one exemplary embodiment consistent with the present disclosure. At operation 510, a strain gauge is applied to the battery. At operation 520, a first strain measurement of the battery (S1) is performed, using the strain gauge, at a selected charge capacity of the battery and at an initial state of the battery. At operation 530, a second strain measurement of the battery (S2) is performed, using the strain gauge, at the selected charge capacity of the battery and at an aged state of the battery. At operation 540, the capacity degradation of the battery, from the initial state to the aged state, is estimated as equal to (S2−S1)/S1. The state of health of the battery may further be based on an average of estimated capacity degradations (as described herein), where each estimated capacity degradation is associated with a selected charge capacity of the battery through the range of the cycle (for example Q1 to Q2 from FIG. 4).

FIG. 6 illustrates a flowchart of operations 600 of another exemplary embodiment consistent with the present disclosure. At operation 610, a first charge cycle test range for the battery is selected. The test range is bounded by a lower charge capacity value ($Q_{low}$) and a higher charge capacity value ($Q_{high}$). At operation 620, at an initial state of the battery, the following operations are performed: (1) a charge-discharge cycle is performed over the first test range; (2) a strain gauge measurement of the battery is obtained at one or more intervals over the first test range; (3) the voltage ($V_{min}$) of the battery is measured at the Qlow bound of the first test range; and (4) voltage ($V_{max}$) of the battery is measured at the Qhigh bound of the first test range. At operation 630, at an aged state of the battery, the following operations are performed: (1) a charge-discharge cycle is performed over a second test range bounded by $V_{min}$ and $V_{max}$; and (2) a strain gauge measurement of the battery is obtained at one or more intervals over the second test range. $V_{min}$ and $V_{max}$ may be used as the boundaries for the second test range to maintain range consistency since $Q_{low}$ and/or $Q_{high}$ may differ between the new battery and the aged battery.

At operation 640, a degradation value is calculated for one or more of the intervals. The degradation value is equal to the difference between the initial state strain gauge measurement and the aged state strain gauge measurement divided by the initial state strain gauge measurement.

In some embodiments, $Q_{low}$ may be selected to be any value greater than or equal to zero amp-hours. In some embodiments, $Q_{high}$ may be selected to be any value less than or equal to a maximum charge capacity value ($Q_{max}$) of the battery. $Q_{max}$ may be specified by the battery manufacturer or determined through testing.

In view of the foregoing, it may be appreciated that the present disclosure also relates to an article comprising a non-transitory storage medium having stored thereon instructions that when executed by a machine result in the performance of the steps of the methods as described in the examples herein such as, for example, in connection with the description associated with FIGS. 5 and 6. In some embodiments, the method operations may be implemented in software and executed by a processor or may be implemented in hardware such as, for example, an application specific integrated circuit (ASIC) or field programmable gate array (FPGA).

Figure 7:
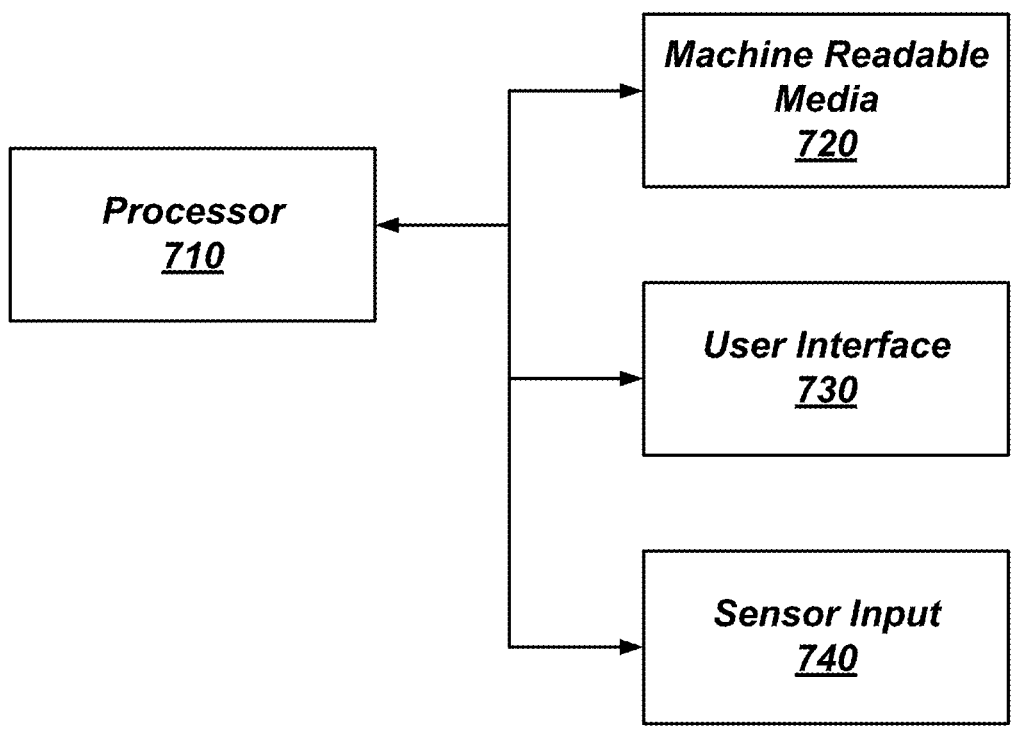
FIG. 7 illustrates a processor, machine readable media, user interface and sensor input that may be employed in an exemplary embodiment consistent with the present disclosure.

It should also be appreciated that the functionality described herein for the embodiments of the present invention may therefore be implemented by using hardware, software, or a combination of hardware and software, as desired. If implemented by software, a processor and a machine readable medium are required. The processor may be any type of processor capable of providing the speed and functionality required by the embodiments of the invention. Machine-readable memory includes any non-transitory media capable of storing instructions adapted to be executed by a processor. Non-transitory media include all computer-readable media with the exception of a transitory, propagating signal. Some examples of such memory include, but are not limited to, read-only memory (ROM), random-access memory (RAM), programmable ROM (PROM), erasable programmable ROM (EPROM), electronically erasable programmable ROM (EEPROM), dynamic RAM (DRAM), magnetic disk (e.g., floppy disk and hard drive), optical disk (e.g. CD-ROM), and any other device that can store digital information. The instructions may be stored on a medium in either a compressed and/or encrypted format. Accordingly, in the broad context of the present invention, and with attention to FIG. 7, the system and method for the herein disclosed strain measurement based battery testing may be accomplished with a processor (710) and machine readable media (720) and user interface (730) plus sensor input (740).

The foregoing description of several methods and embodiments has been presented for purposes of illustration. It is not intended to be exhaustive or to limit the claims to the precise steps and/or forms disclosed, and obviously many modifications and variations are possible in light of the teaching herein. It is intended that the scope of the invention be defined by the claims appended hereto.

What is claimed is:

1. A method for estimating a capacity degradation of a battery from an initial state to an aged state, said method comprising:
    applying a strain gauge to said battery;
    measuring a first strain of said battery (S1), using said strain gauge, at a selected charge capacity of said battery and at said initial state of said battery;
    measuring a second strain of said battery (S2), using said strain gauge, at said selected charge capacity of said battery and at said aged state of said battery;
    receiving, by a controller, said measured first strain (S1) and said measured second strain (S2) and estimating said capacity degradation equal to (S2−S1)/S1;
    determining, by said controller, an absolute charge capacity (Q) for said battery based on said estimated capacity degradation; and
    performing, by said controller, a subsequent charge-discharge cycle via a charging circuit based at least in part on the determined absolute charge capacity (Q).

2. The method of claim 1, further comprising estimating a state of health of said battery based on an average of a plurality of said estimated capacity degradations, wherein each of said estimated capacity degradations is associated with a selected charge capacity of said battery.

3. The method of claim 1, wherein said strain gauge is applied with direct physical contact to said battery.

4. The method of claim 1, wherein said strain gauge is applied to a strap, said strap configured to secure one or more battery cells of said battery.

5. The method of claim 1, further comprising maintaining said battery at a temperature of 20 to 40 degrees Celsius during said strain measurements.

6. The method of claim 1, wherein said strain gauge is applied to said battery along a selected dimension comprising at least one of a length, width or height of said battery, said selected dimension based on a response of said battery to a change from said initial state to said aged state.

7. The method of claim 1, wherein said strain gauge is applied to said battery along a selected dimension comprising any combination of length, width and height of said battery, said selected dimension based on a response of said battery to a change from said initial state to said aged state.

8. The method of claim 1, wherein said strain gauge is applied to said battery along a selected dimension to measure a change in volume of said battery, said selected dimension based on a response of said battery to a change from said initial state to said aged state.

9. A method for calculating a capacity degradation value of a battery from an initial state to an aged state, said method comprising:
    selecting, by a controller, a first charge cycle test range, said first test range bounded by a lower charge capacity value ($Q_{low}$) and a higher charge capacity value ($Q_{high}$);
    at said initial state of said battery:
        performing, by said controller, a charge-discharge cycle via a charging circuit on said battery over said first test range;

obtaining, by said controller, via a strain gauge, a strain gauge measurement of said battery at one or more intervals over said first test range;

measuring, by said controller, a voltage ($V_{min}$) of said battery at said $Q_{low}$ bound of said first test range;

measuring, by said controller, a voltage ($V_{max}$) of said battery at said $Q_{high}$ bound of said first test range;

at said aged state of said battery:

performing, by said controller, a charge-discharge cycle on said battery via said charging circuit over a second test range, said second test range bounded by $V_{min}$ and $V_{max}$;

obtaining, by said controller, a strain gauge measurement of said battery at said one or more intervals over said second test range;

calculating, by said controller, a capacity degradation value for at least one of said one or more intervals, said capacity degradation value equal to the difference between said initial state strain gauge measurement and said aged state strain gauge measurement divided by said initial state strain gauge measurement;

determining, by said controller, an absolute charge capacity (Q) for said battery based on said calculated capacity degradation value; and performing, by said controller, a subsequent charge-discharge cycle via the charging circuit based at least in part on the determined absolute charge capacity (Q).

10. The method of claim 9, further comprising estimating a state of health of said battery based on an average of said calculated capacity degradation values for each of said intervals.

11. The method of claim 9, wherein said charge-discharge cycle is performed at a continuous current rate or at a continuous power rate.

12. The method of claim 9, wherein said charge-discharge cycle is performed at a variable current rate or at a variable power rate.

13. The method of claim 9, wherein $Q_{low}$ is greater than or equal to zero amp-hours and $Q_{high}$ is less than or equal to a maximum charge capacity value associated with said battery.

14. The method of claim 9, wherein said strain gauge is applied with direct physical contact to said battery.

15. The method of claim 9, wherein said strain gauge is applied to a strap, said strap configured to secure one or more battery cells of said battery.

16. The method of claim 9, further comprising maintaining said battery at a temperature of 20 to 40 degrees Celsius during said strain gauge measurements.

17. The method of claim 9, wherein said strain gauge is applied to said battery along a selected dimension comprising at least one of a length, width or height of said battery, said selected dimension based on a response of said battery to a change from said initial state to said aged state.

18. The method of claim 9, wherein said strain gauge is applied to said battery along a selected dimension comprising any combination of length, width and height of said battery, said selected dimension based on a response of said battery to a change from said initial state to said aged state.

19. The method of claim 9, wherein said strain gauge is applied to said battery along a selected dimension to measure a change in volume of said battery, said selected dimension based on a response of said battery to a change from said initial state to said aged state.

20. An article comprising a non-transitory storage medium having stored thereon instructions that when executed by a machine result in the following operations for calculating a capacity degradation value of a battery from an initial state to an aged state:

selecting a first charge cycle test range, said first test range bounded by a lower charge capacity value ($Q_{low}$) and a higher charge capacity value ($Q_{high}$);

at said initial state of said battery:

performing a charge-discharge cycle on said battery over said first test range;

obtaining, via a strain gauge, a strain gauge measurement of said battery at one or more intervals over said first test range;

measuring a voltage ($V_{min}$) of said battery at said $Q_{low}$ bound of said first test range;

measuring a voltage ($V_{max}$) of said battery at said $Q_{high}$ bound of said first test range;

at said aged state of said battery:

performing a charge-discharge cycle on said battery over a second test range, said second test range bounded by $V_{min}$ and $V_{max}$;

obtaining a strain gauge measurement of said battery at said one or more intervals over said second test range;

calculating a capacity degradation value for at least one of said one or more intervals, said capacity degradation value equal to the difference between said initial state strain gauge measurement and said aged state strain gauge measurement divided by said initial state strain gauge measurement;

determining an absolute charge capacity (Q) for said battery based on said calculated capacity degradation value; and performing a subsequent charge-discharge cycle via a charging circuit based at least in part on the determined absolute charge capacity (Q).

21. The article of claim 20, further comprising the operation of estimating a state of health of said battery based on an average of said calculated capacity degradation values for each of said intervals.

22. The article of claim 20, wherein said charge-discharge cycle is performed at a continuous current rate or at a continuous power rate.

23. The article of claim 20, wherein said charge-discharge cycle is performed at a variable current rate or at a variable power rate.

24. The article of claim 20, wherein $Q_{low}$ is greater than or equal to zero amp-hours and $Q_{high}$ is less than or equal to a maximum charge capacity value associated with said battery.

25. The article of claim 20, wherein said strain gauge is applied with direct physical contact to said battery.

26. The article of claim 20, wherein said strain gauge is applied to a strap, said strap configured to secure one or more battery cells of said battery.

27. The article of claim 20, further comprising the operation of maintaining said battery at a temperature of 20 to 40 degrees Celsius during said strain measurements.

28. The article of claim 20, wherein said strain gauge is applied to said battery along a selected dimension comprising at least one of a length, width or height of said battery, said selected dimension based on a response of said battery to a change from said initial state to said aged state.

29. The article of claim 20, wherein said strain gauge is applied to said battery along a selected dimension comprising any combination of length, width and height of said battery, said selected dimension based on a response of said battery to a change from said initial state to said aged state.

30. The article of claim 20, wherein said strain gauge is applied to said battery along a selected dimension to measure a change in volume of said battery, said selected dimension based on a response of said battery to a change from said initial state to said aged state.

\* \* \* \* \*